United States Patent [19]

Reuschle

[11] Patent Number: 4,763,082
[45] Date of Patent: Aug. 9, 1988

[54] SELECTABLE TUNER PREAMPLIFIER

[75] Inventor: Roland Reuschle, Kirchheim /N, Fed. Rep. of Germany

[73] Assignee: Telefunken Electronic GmbH, Heilbronn, Fed. Rep. of Germany

[21] Appl. No.: 46,533

[22] Filed: May 6, 1987

[30] Foreign Application Priority Data

Aug. 6, 1986 [DE] Fed. Rep. of Germany ....... 3626575

[51] Int. Cl.⁴ ............................................. H03F 3/68
[52] U.S. Cl. ..................................... 330/295; 330/126
[58] Field of Search ............... 330/126, 277, 295, 300; 455/188, 190

[56] References Cited

U.S. PATENT DOCUMENTS

| | | | |
|---|---|---|---|
| 3,482,167 | 12/1969 | Kaplan | 455/242 |
| 4,338,572 | 7/1982 | Schürmann | 330/277 |
| 4,438,529 | 3/1984 | Sato | 455/190 |

FOREIGN PATENT DOCUMENTS

| | | |
|---|---|---|
| 1812292 | 8/1969 | Fed. Rep. of Germany . |
| 2533355 | 1/1977 | Fed. Rep. of Germany . |
| 2808745 | 9/1979 | Fed. Rep. of Germany . |
| 2911514 | 9/1980 | Fed. Rep. of Germany . |
| 148422 | 5/1981 | German Democratic Rep. . |

OTHER PUBLICATIONS

Harrison, Graham, "MOSFET IF. Preamp.", *Television*, vol. 26, No. 6, Apr. 1976, p. 288.
Rayer, F. G., "3-Band RF Mini-Amp", *Practical Wireless*, vol. 52, No. 1, May 1976, pp. 26-28.
Funktechnik ohne Ballast, Otto Limann, Franzis-Verlag Munchen, 12 Aufl., 1972, pp. 110–111.

*Primary Examiner*—Eugene R. Laroche
*Assistant Examiner*—Steven J. Mottola
*Attorney, Agent, or Firm*—Spencer & Frank

[57] ABSTRACT

In a selectable tuner preamplifier with a field-effect transistor tetrode comprised of a compound semiconductor and having the high-frequency input signal fed to one gate electrode and the control signal for controlling the high-frequency input signal fed to the other gate electrode, a component with a diode characteristic is provided for prevention of undesired current flow at the gate electrode controlling the high-frequency input signal when a band is selected and control voltage is applied.

8 Claims, 1 Drawing Sheet

SELECTABLE TUNER PREAMPLIFIER

BACKGROUND OF THE INVENTION

The invention relates to a selectable tuner preamplifier with a field-effect transistor tetrode which is comprised of a compound semiconductor. The high-frequency input signal is fed to one gate electrode and the control signal for controlling the high-frequency input signal is fed to the other gate electrode. Band selection is effected by switching off the drain voltage supply.

Such a tuner preamplifier is employed, for example, in a television tuner. FIG. 1 shows the circuit diagram (block diagram) of a television tuner. As is apparent from FIG. 1, the antenna signal is fed to a matching network 1 in a television tuner. The output signal of matching network 1 is fed to the two preamplifiers, i.e., UHF stage 2 and VHF stage 3. Band filter 4 is connected downstream from UHF stage 2 and band filter 5 downstream from VHF stage 3. In addition to the HF signal, UHF stage 2 and VHF stage 3 are fed a further signal, the so-called AGC signal, from AGC stage 6. The AGC signal serves to control (attenuate) the high-frequency input signal. "AGC" is the abbreviation for "automatic gain control". The AGC stage is, for example, an IF integrated circuit. IF is the abbreviation for intermediate frequency. Band selector 7 serves to feed the operating voltage to either UHF stage 2 or VHF stage 3.

A preamplifier such as the UHF stage or VHF stage shown in FIG. 2 comprises, for example, a field-effect transistor tetrode 8 with drain D, source S and gate electrodes G1 and G2. In today's technology, field-effect transistor tetrodes having a semiconductor substrate comprised of a compound semiconductor such a gallium-arsenide are employed to some extent in selectable tuner preamplifiers. Use of field-effect transistor tetrodes comprised of a compound semiconductor in a preamplifier has, for example, the following advantages: higher power gain, less noise, more selectivity, improved large-signal behavior.

In the preamplifier shown in FIG. 2, resistors 9 and 10 constitute a voltage divider for adjustment of the operating point at gate electrode G1 of field-effect transistor tetrode 8. The drain electrode of field-effect transistor tetrode 8 is directly connected to the operating voltage, while resistors 11 and 12 serve to adjust the bias voltage at the source electrode.

If the preamplifier stage shown in FIG. 2 is used, for example, in a television tuner, a band is switched off and a band is selected, respectively. In this case, the drain voltage supply at the field-effect transistor tetrode is switched off.

SUMMARY OF THE INVENTION

The invention is based on the knowledge that switching off and selecting bands in a preamplifier of the kind shown in FIG. 2 can destroy the field-effect transistor tetrode. The object underlying the invention is to provide a selectable preamplifier of the kind mentioned at the outset wherein the possibility of the field-effect transistor tetrode being destroyed is eliminated. This object is achieved in accordance with the invention in a selectable tuner preamplifier of the kind mentioned at the outset by provision of a component with a diode characteristic which prevents undesired current flow at the gate electrode for controlling the high-frequency input signal when a band is selected and a band is switched off, respectively, and control voltage is applied.

The invention is based on the knowledge that when a band is switched off and a band is selected by switching off the drain voltage supply, there is no longer any potential at the drain of the field-effect transistor tetrode and, consequently, when AGC is applied, the Schottky diode formed by the gate electrode which has a controlling function and the semiconductor substrate begins to conduct in the forward direction. An undesired current which can destroy the field-effect transistor tetrode is thereby generated. This effect is prevented, in accordance with the invention, by a component with a diode characteristic.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
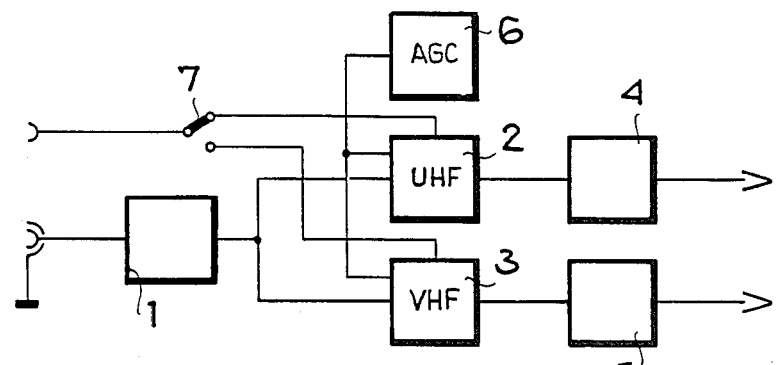
FIG. 1 is a circuit diagram of a television tuner.
Figure 2:
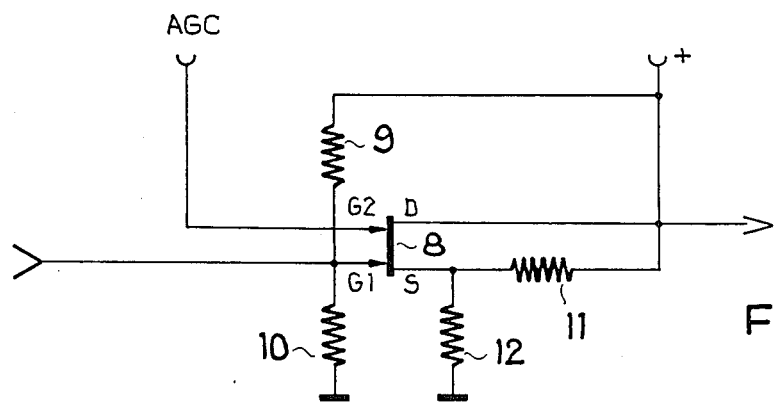
FIG. 2 is a circuit diagram of a preamplifier.
Figure 3:
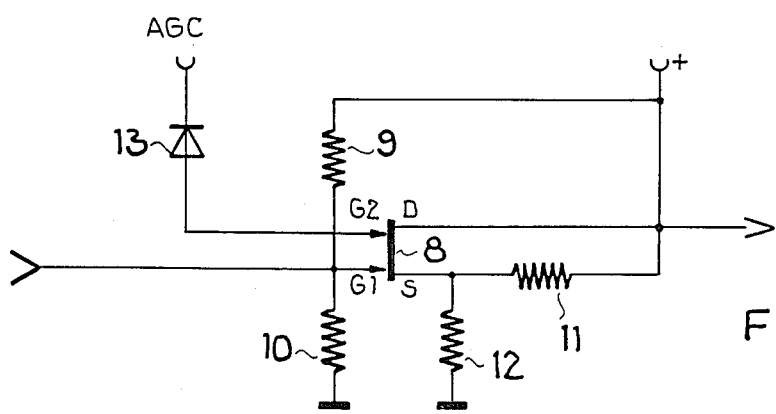
FIG. 3 shows a tuner preamplifier in accordance with the invention.

FIG. 3 shows a preamplifier stage (e.g. VHF, UHF) in accordance with the invention. The preamplifier stage shown in FIG. 3 differs from the preamplifier stage shown in FIG. 2 in that, in accordance with the invention, a diode 13 is connected upstream from gate electrode G2 of field-effect transistor tetrode 8. Similarly to any other component with a diode characteristic, the diode prevents current flow when the stage is switched off, and, consequently, a current load on the high-impedance AGC voltage source (e.g. IF integrated circuit). When the amplifier stage is in the active stage, a low cut-off current of the field-effect transistor tetrode flows in the reverse direction and causes a minor voltage drop at the component with the diode characteristic. There are, therefore, no negative influences on the control behavior of the field-effect transistor tetrode.

What is claimed is:

1. In a selectable tuner preamplifier for receiving a high-frequency input signal and a control signal, said preamplifier including a field-effect transistor tetrode having first and second gate electrodes and a drain electrode, the high-frequency input signal being fed to one of said gate electrodes, the control signal to the other of said gate electrodes and a drain voltage supply being connected to said drain electrode, band selection being effected by switching off said drain voltage supply, the improvment comprising
    means having a diode characteristic coupled to one of said gate electrodes, said means preventing undesired current flow at the gate electrode to which said high-frequency input signal is fed when a band is selected and said control voltage is applied to the other of said gate electrodes.

2. A tuner preamplifier as defined in claim 1, wherein the control signal is fed to said second gate electrode and said means having a diode characteristic is connected in series with said second gate electrode.

3. A tuner preamplifier as defined in claim 1, wherein said field-effect transistor tetrode is a tetrode with a metal-semiconductor gate electrode.

4. A tuner preamplifier as defined in claim 3, wherein said tetrode is a dual-gate-n-channel-field-effect transistor.

5. A tuner preamplifier as defined in claim 1, wherein said means having a diode characteristic is a diode.

6. A tuner preamplifier as defined in claim 1, wherein said means having a diode characteristic is, a Zener diode.

7. A tuner preamplifier as defined in claim 1, wherein said means having a diode characteristic is, a light-emitting diode.

8. A tuner preamplifier as defined in claim 1, wherein said means having a diode characteristic is, a transistor.

* * * * *